United States Patent
Wu

(10) Patent No.: US 6,984,896 B2
(45) Date of Patent: Jan. 10, 2006

(54) IC CHIP PACKAGE

(76) Inventor: Cheng-Chiao Wu, No. 114, Chung San Rd., Taichung (TW)

( * ) Notice: Subject to any disclaimer, the term of this patent is extended or adjusted under 35 U.S.C. 154(b) by 72 days.

(21) Appl. No.: 10/232,695

(22) Filed: Sep. 3, 2002

(65) Prior Publication Data

US 2003/0081390 A1 May 1, 2003

(30) Foreign Application Priority Data

Nov. 1, 2001 (TW) .............................. 90127111 A

(51) Int. Cl.
 *H01L 23/48* (2006.01)
 *H01L 23/52* (2006.01)
 *H01L 29/40* (2006.01)
(52) U.S. Cl. ..................................... 257/784
(58) Field of Classification Search ................ 257/735, 257/784, 787
See application file for complete search history.

(56) References Cited

U.S. PATENT DOCUMENTS 6,218,731 B1 * 4/2001 Huang et al. ............... 257/738

* cited by examiner

*Primary Examiner*—David A. Zarneke
(74) *Attorney, Agent, or Firm*—Browdy and Neimark, PLLC

(57) ABSTRACT

An IC chip packaging comprises a carrier having a topside, a bottom side and a passage having an opening on the topside and another opening on the bottom side, a chip mounted on the topside of the carrier and covering the opening on the topside, a plurality of bonding wires each having one end electrically connected to said chip covered on the opening on the topside and an opposite end horizontally electrically connected to the bottom side of the carrier through the opening on the bottom side, and a protective member covering the opening on the bottom side and the opposite ends of the bonding wires. The protective member has a height vertically extended from a bottom side thereof to the carrier within 0.4 mm.

16 Claims, 9 Drawing Sheets

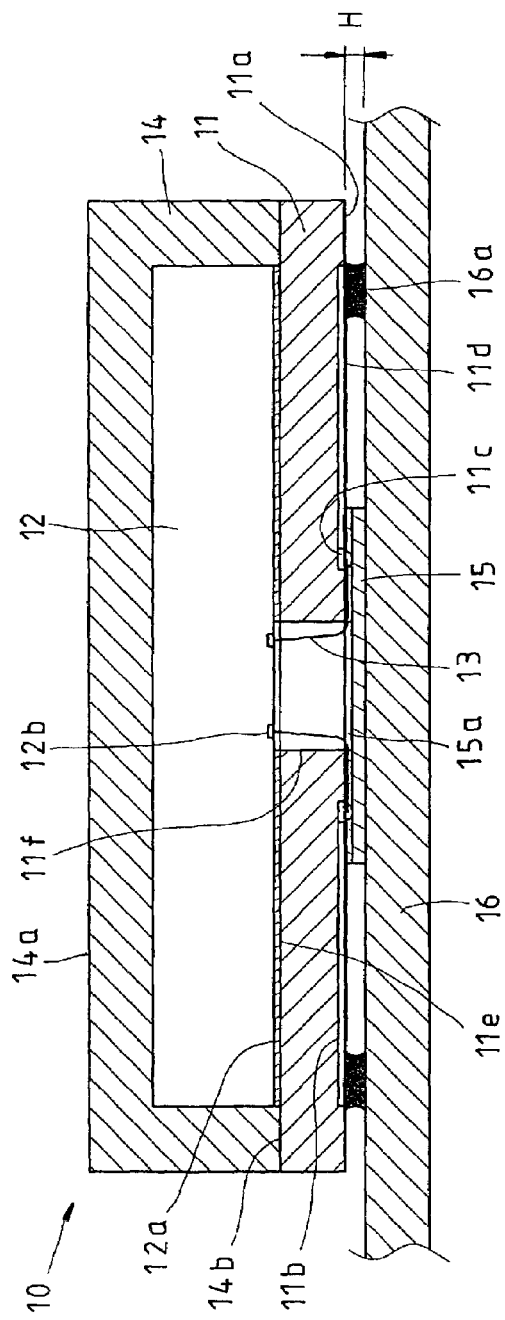
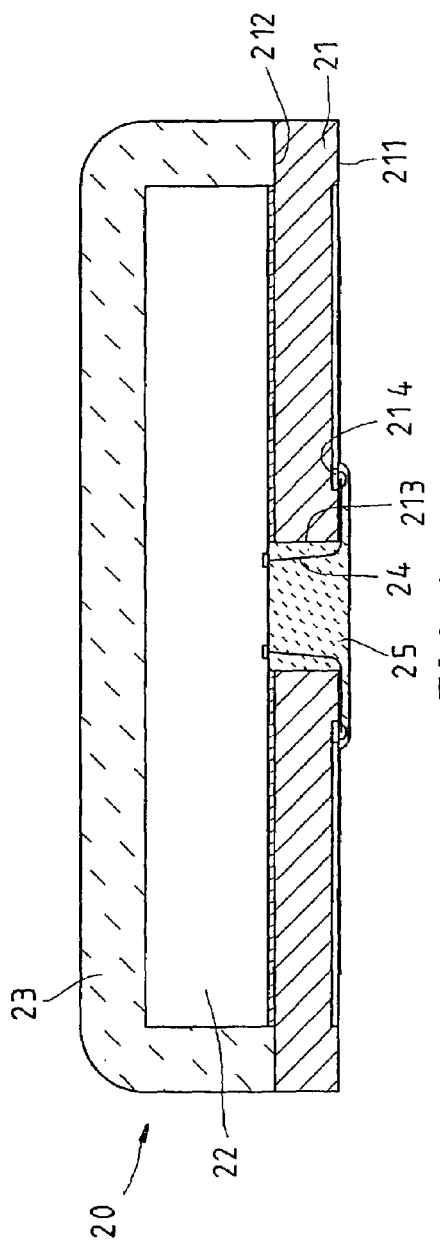
FIG. 3
FIG. 4

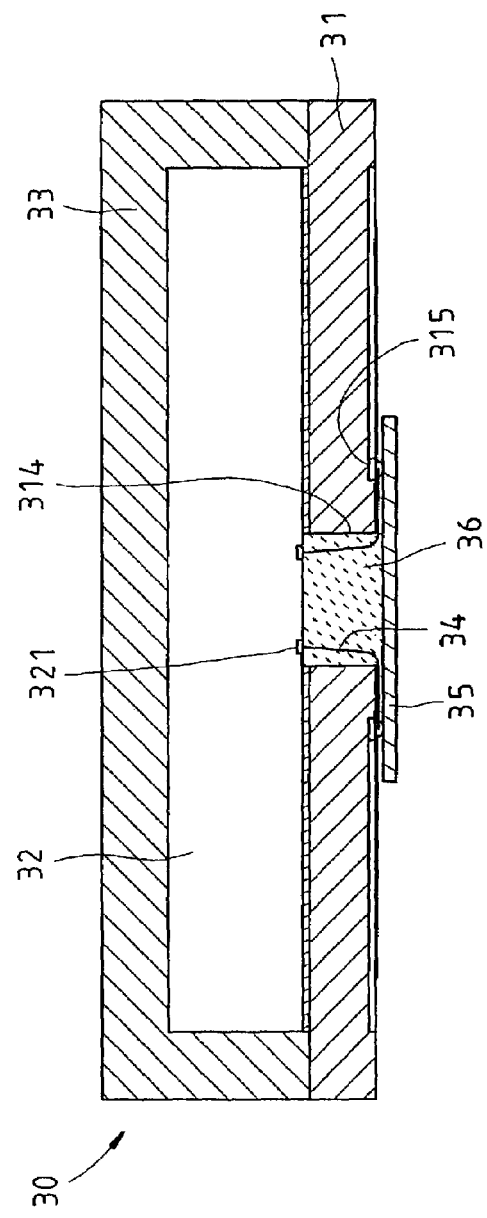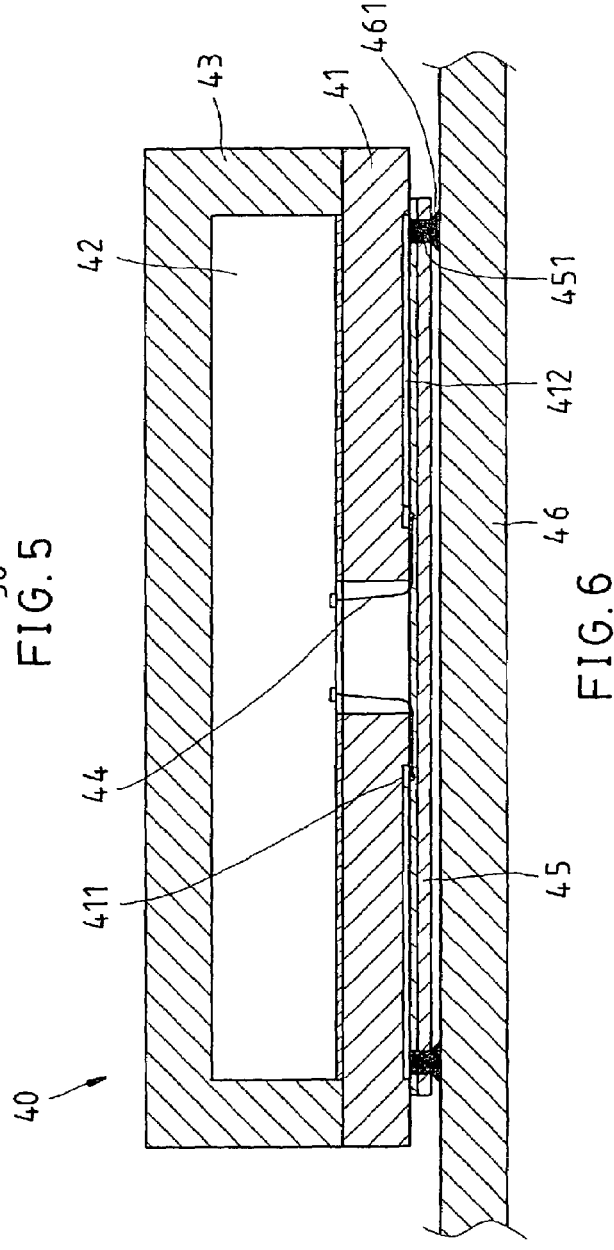

6,984,896 B2

IC CHIP PACKAGE

BACKGROUND OF THE INVENTION

1. Field of the Invention

The present invention relates to an IC chip package and, more specifically, to a small size IC chip package, which greatly reduces the dimensions of the whole package.

2. Description of the Related Art

Because regular IC chips are fragile, they must be well packaged and protected against external force. After packaging of an IC chip, the IC chip can be effectively electrically connected to an external circuit board. Following fast and free development of high-tech, IC chip packages are made lighter, thinner, shorter, and smaller. FIG. 1 illustrates an IC chip package 1 according to the prior art. According to this design, the IC chip package 1 comprises a substrate 3, the substrate 3 having a passage 3a through the top and bottom sides thereof, a chip 2 fixedly mounted on the topside of the substrate 3, the chip 2 having a plurality of bonding pads 2a disposed at one end of the passage 3a, a plurality of bonding wires 4 extended through the passage 3a, the bonding wires 4 each having one end respectively connected to the bonding pads 2a of the chip 2 and the other end connected to bonding pads 3b on the substrate 3, two protective covers 5, 5' respectively covered on the chip 2 and the bonding pads 3b and bonding wires 4 of the substrate 3, a solder mask 7 covered over the circuits 6 of the substrate 3, and a plurality of solder balls 8 respectively electrically connected to the conductive circuit pattern 6 outside the solder mask 7 and adapted for connecting the conductive circuit pattern 6 to tin solder paste 9a pre-applied on an external circuit board 9.

According to the aforesaid package 1, the bottom side of the substrate 3 must leave sufficient space for receiving bonding wires so that the bonding wires 4 can be extended through the passage 3a and connected between the bonding pads 2a at the chip 2 and the bonding pads 3b at the substrate 3. When the protective cover 5' covered on the whole area of the bonding pads 3b on the substrate 3b and the bonding wires 4, the vertical height H of the protective cover 5' between the bottom side of the protective cover 5' and the substrate 3 is tall. Therefore, a relatively higher interface must be used for enabling the substrate 3 to be electrically connected to the external circuit board 9, i.e., the solder balls 6 must be greater than the vertical height H of the protective cover 5' for soldering to the solder paste 9a at the external circuit board 9. According to this design, the vertical height of the solder balls 6 is about 0.5 mm. The use of the big solder balls 6 greatly increases the dimensions of the IC chip package 1.

SUMMARY OF THE INVENTION

The present invention has been accomplished under the circumstances in view. It is one object of the present invention to provide an IC chip package, which greatly reduces the dimensions of the whole package.

To achieve the object of the present invention, an IC chip packaging comprises a carrier having a topside, a bottom side and a passage having an opening on the topside and another opening on the bottom side, a chip mounted on the topside of the carrier and covering the opening on the topside, a plurality of bonding wires each having one end electrically connected to said chip covered on the opening on the topside and an opposite end horizontally electrically connected to the bottom side of the carrier through the opening on the bottom side, and a protective member covering the opening on the bottom side and the opposite ends of the bonding wires. The protective member has a height vertically extended from a bottom side thereof to the carrier within 0.4 mm.

BRIEF DESCRIPTION OF THE DRAWINGS

FIG. 3 is a sectional view of the first embodiment of the present invention showing the IC chip package installed in an external circuit board.

FIG. 4 is a sectional view of an IC chip package constructed according to a second embodiment of the present invention.

FIG. 5 is a sectional view of an IC chip package constructed according to a third embodiment of the present invention.

FIG. 6 is a sectional view of an IC chip package constructed according to a fourth embodiment of the present invention.

DETAILED DESCRIPTION OF THE PREFERRED EMBODIMENT

Figure 1:
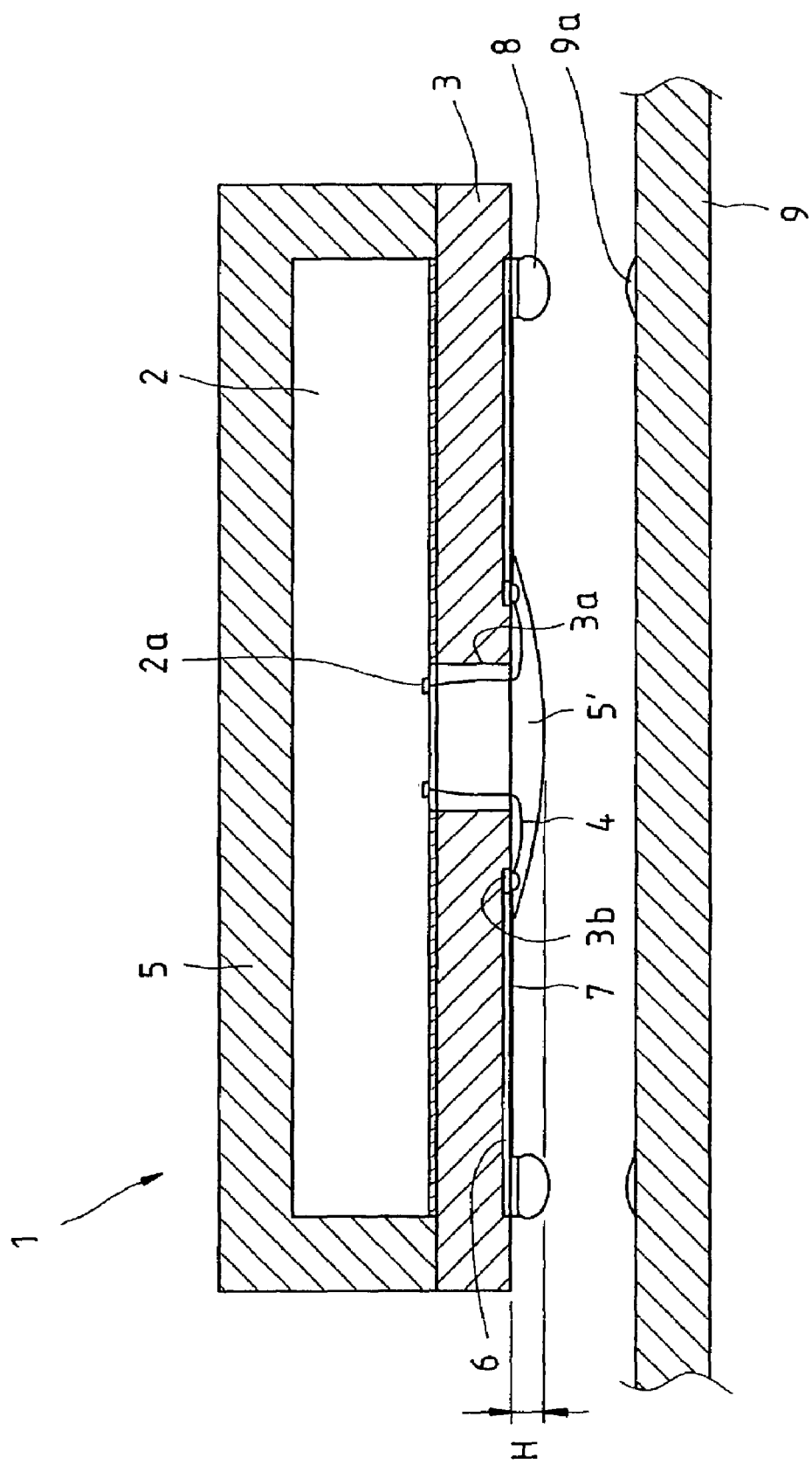
FIG. 1 is a sectional view showing an IC chip package constructed according to the prior art.
Figure 2:
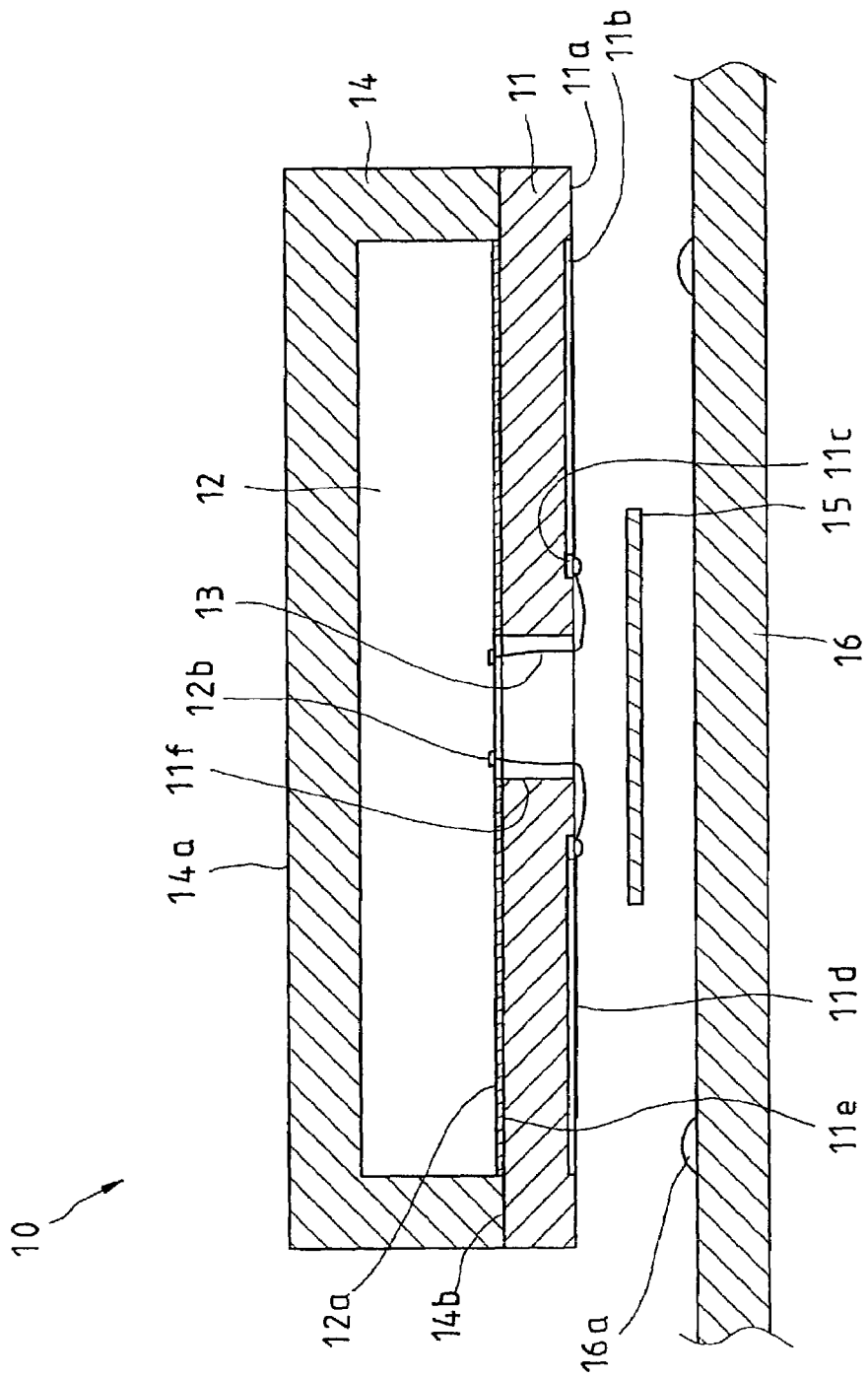
FIG. 2 is an exploded view of an IC chip package constructed according to a first embodiment of the present invention.

Referring to FIGS. 2 and 3, an IC chip package 10 in accordance with the present invention is shown comprised of a carrier 11, a chip 12, bonding wires 13, a chip shield 14, and a protective member 15 in the form of a preformed flat thin sheet member.

The carrier 11 is a PCB (printed circuit board) made of plastics, fiberglass reinforced plastic material, ceramics, etc., having a bottom side 11a, a topside 11e opposite to the bottom side 11a, a predetermined conductive circuit pattern 11b arranged on the bottom side 11a, a plurality of bonding pads 11c arranged in the bottom side 11a and respectively connected to the conductive circuit pattern 11b, a passage 11f cut through the bottom side 11a and the topside 11e, i.e. the passage has an opening on the topside of the carrier and another opening on the bottom side of the carrier, and an solder mask 11d covered on the bottom side 11a over the conductive circuit pattern 11b, leaving a part of the circuit pattern 11b to be exposed to the outside for connection to external electric conducting means. The PCB of the carrier 11 can be a single layer PCB or laminated PCB. For illustration purpose only, the PCB shown in the drawings is a single layer PCB.

The chip 12 (for easy understanding of the present invention, only one chip is used) is bonded to the topside 11*e* of the carrier 11 directly by a bonding material 12*a*, for example, epoxy resin, silicon resin, glass of low melting point, or double-side glue, covering the opening of the passage on the topside. The chip has a plurality of bonding pads 12*b* corresponding with the passage 11*f*.

The bonding wires 13 are made of gold or aluminum alloy, each having one end respectively fastened to the bonding pads 12*b* of the chip 12 by a bonding tool (not shown) and an opposite end substantially horizontally connected to the bonding pads 11*c* on the bottom side 11*a* of the carrier 11 through the passage. Because the bonding wires 13 each have a part horizontally extended outside the passage 11*f* and respectively connected to the bonding pads 11*c* in the bottom side 11*a* of the carrier 11, the height of the bonding wires 13 at the bottom side 11*a* of the carrier 11 is minimized.

The chip shield 14 can be an opaque cover member made of plastics or metal, or a transparent cover member made of glass or plastics, having a topside 14*a* and a bottom side 14*b*. The bottom side 14*b* has a center area recessed, forming a receiving chamber (not shown). The bottom side 14*b* is bonded to the topside 11*e* of the carrier 11 through an adhesive material (not shown), keeping the chip 12 protected in the receiving chamber in the bottom side 14*b* of the chip shield 14 against outside force or contamination.

The flat thin sheet member 15 according to this embodiment is a thin sheet member having a width greater than the distance between the bonding pads 11*c* in the bottom side 11*a* of the carrier 11 at two sides of the passage 11*f*. The flat thin sheet member 15 is bonded to the bottom side 11*a* of the carrier 11 by a bonding agent 15*a*, and covered over the bonding pads 11*c*, the passage 11*f* and flattens the bonding wires 13 against the bottom side 11*a* of the carrier 11 (see FIG. 3). As illustrated in FIG. 3, when installed, the height H' of the protective member 15 does not surpass 0.4 mm. Preferably the height H' of the protective member 15 is within 0.08~0.125 mm (because the height of tin solder paste is about 0.15 mm, tin soldering paste can be maintained in direct contact with the carrier without interfering with the protective member if the thickness of the protective member is maintained within 0.08~0.125 mm)

Referring to FIG. 3 again, when installing the IC chip package 10 in an external circuit board 16, a conducting glue, for example, tin soldering paste 16*a* is applied to the circuit board 16 corresponding to the exposed part of the conductive circuit pattern 11*b*. By means of tin soldering paste 16*a*, the external circuit board 16 is bonded to the exposed part of the conductive circuit pattern 11*b* in the bottom side 11*a* of the carrier 11 of the IC chip package 10, keeping the bonding wires 13 electrically connected to the external circuit board 16. Because the cover height of the thin sheet member is smaller than 0.4 mm (lower than the height 0.5 mm of solder balls), it is not necessary to use relatively taller solder balls as interface means for electric connection, and the tin soldering paste 16*a* directly electrically connects the external circuit board 16 to the conductive circuit pattern 11*b* in the bottom side 11*a* of the carrier 11 of the IC chip package 10. Therefore, this design greatly reduces the packaging procedure and dimensions.

FIG. 4 shows an IC chip package 20 constructed according to the second embodiment of the present invention. According to this embodiment, the IC chip package 20 is comprised of a carrier 21, a chip 22, a chip shield 23, bonding wires 24, and a protective member 25. The main features of this embodiment are outlined hereinafter.

The carrier 21 is a plate member having a bottom side 211, a topside 212, and a passage 213 cut through the bottom side 211 and the topside 212.

The chip 22 is directly bonded to the topside 212 of the carrier 21.

The chip shield 23 is made of synthesized resin, for example, epoxy resin or silicon resin, and directly molded on the chip 22, keeping the chip 22 well protected by the chip shield 23.

The protective member 25 is made of synthesized resin, for example, epoxy resin or silicon resin, and directly molded on the bonding pads 214 and the bonding wires 24 in the bottom side 211 of the carrier 21 to seal the passage 213. Because the bonding wires 24 are horizontally extended outside the passage 213 and respectively connected to the bonding pads 214 in the bottom side 211 of the carrier 21, the height of the bonding wires 24 in the bottom side 211 of the carrier 21 is minimized so that the height of the protective member 25 after installation can be reduced to the level below 0.4 mm.

FIG. 5 shows an IC chip package 30 constructed according to the third embodiment of the present invention. According to this embodiment, the IC chip package 30 is comprised of a carrier 31, a chip 32, bonding wires 34, a chip shield 33, and a protective member 35. The main features of this embodiment are outlined hereinafter.

The protective member 35 is a thin sheet of plate member.

The passage 314 of the carrier 31 is sealed with a second protective member 36. The second protective member 36 is made of synthesized resin, for example, epoxy resin or silicon resin, and directly molded in the passage 314 to protect the bonding pads 321 of the chip 32 and the bonding pads 315 of the carrier 31.

FIG. 6 shows an IC chip package 40 constructed according to the fourth embodiment of the present invention. According to this embodiment, the IC chip package 40 is comprised of a carrier 41, a chip 42, a chip shield 43, bonding wires 44, and a protective member 45. The main features of this embodiment are outlined hereinafter.

The protective member 45 is a thin sheet member. The width and area of the protective member 45 are greater than the combined width and area of the conductive circuit pattern 412 and the bonding pads 411 in the carrier 41 so that the protective member 45 covers the conductive circuit pattern 412 and the bonding pads 411 when installed in the carrier 41. The protective member 45 has at least one through hole 451 corresponding to a predetermined portion of the conductive circuit pattern. By means of applying an electrically conducting glue, for example, tin paste 461 in the through hole 451, the conductive circuit pattern 412 are electrically connected to the external circuit board 46 on which the IC chip package is installed. Therefore, the protective member 45 protects the bonding pads 411 and conductive circuit pattern 412 of the carrier 41 against influence or destruction of external force.

As indicated above, the arrangement of the protective member 45 well protects the conductive circuit pattern 412 against destruction of external force. Therefore, it is not necessary to employ the conventional solder mask to protect the conductive circuit pattern 412 of the carrier 41.

Figure 7:
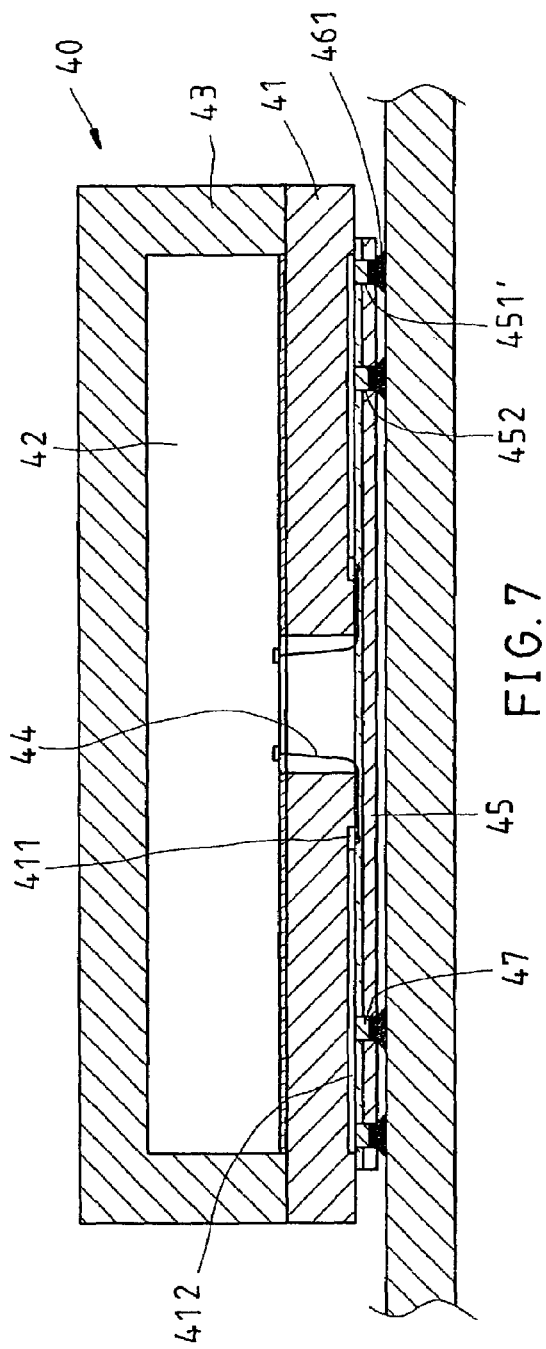
FIG. 7 is a sectional view of an alternate form of the IC chip package according to the fourth embodiment of the present invention.
Figure 7A:
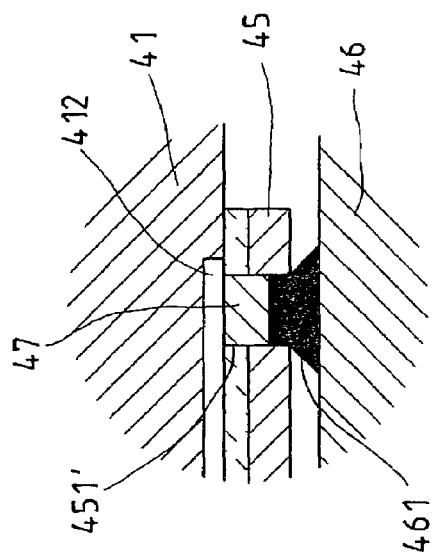

Referring to FIGS. 7 and 7A, the protective member 45 is made having two serial through holes 451', 452 respectively mounted with conducting member 47 made of gold, silver, tin, or lead. The conducting member 47 is bonded to the conductive circuit pattern 412 of the carrier 41 by soldering, plating, print, etc. The conducting member 47 is embedded in the through holes 451', 452. During installation of the IC chip package 40 in the external circuit board 46, tin soldering paste 461 is applied to the conducting member 47 and the external circuit board 46, keeping the conductive circuit pattern 412 of the carrier 41 electrically connected to the external circuit board 46 without increasing the dimensions between the carrier 41 and the external circuit board 46.

Figure 8:
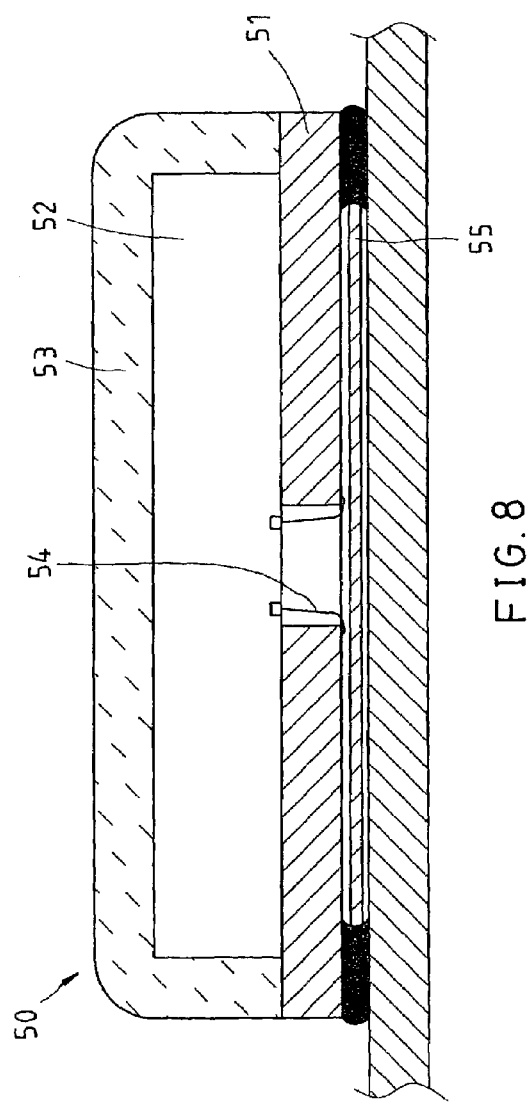
FIG. 8 is a sectional view of an IC chip package constructed according to a fifth embodiment of the present invention.
Figure 9:
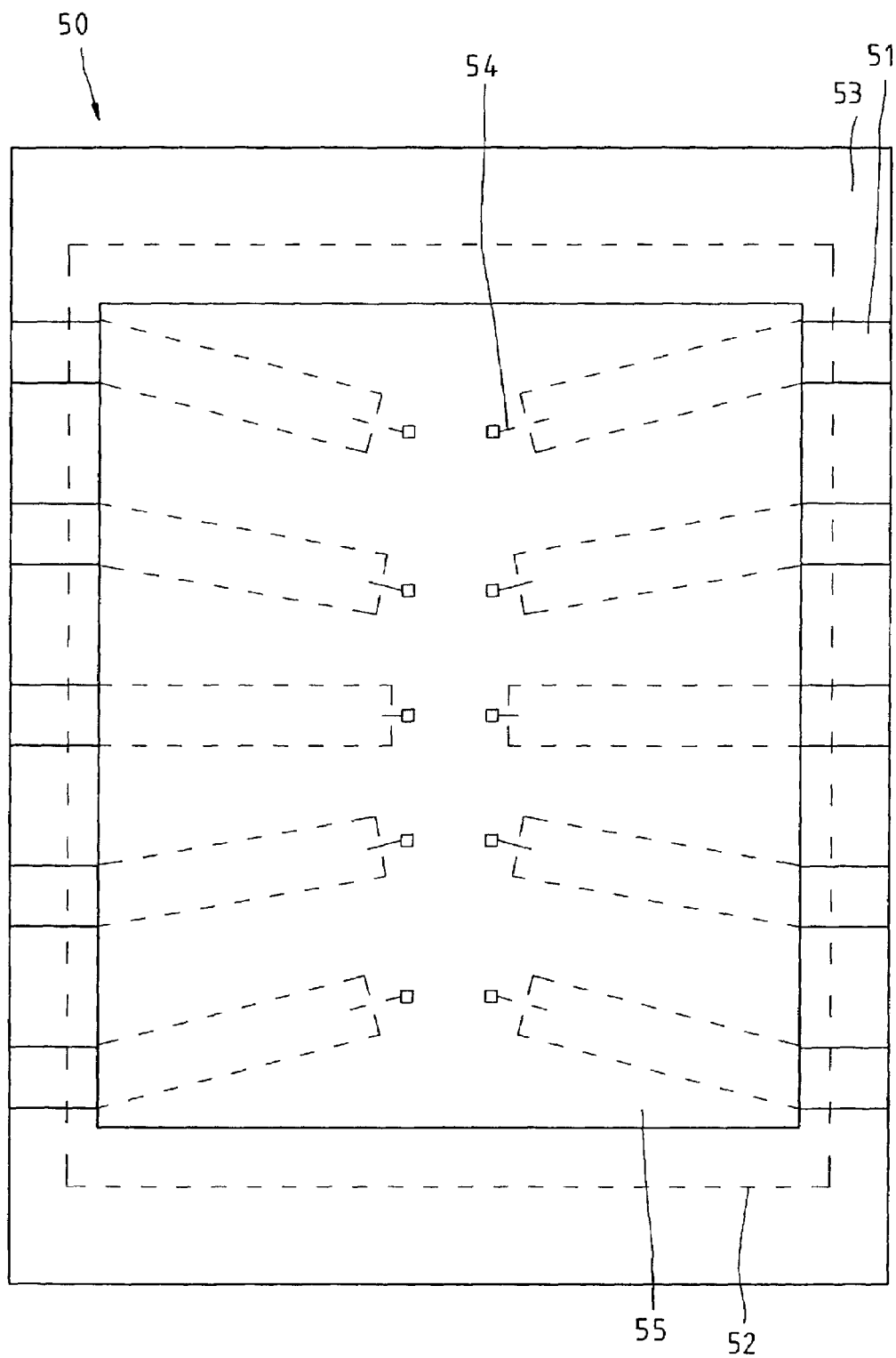
FIG. 9 is a bottom view of the fifth embodiment of the present invention after removal of the external circuit board.

FIGS. 8 and 9 show an IC chip package 50 constructed according to the fifth embodiment of the present invention. According to this embodiment, the IC chip package 50 is comprised of a carrier 51, a chip 52, a chip shield 53, bonding wires 54, and a protective member 55. The main features of this embodiment are outlined hereinafter.

The carrier 51 is made of metal and formed of a plurality of contact leads for carrying the chip 52 and electrically connecting the chip 52 to an external circuit board. The protective member 55 is a thin sheet member.

Figure 11:
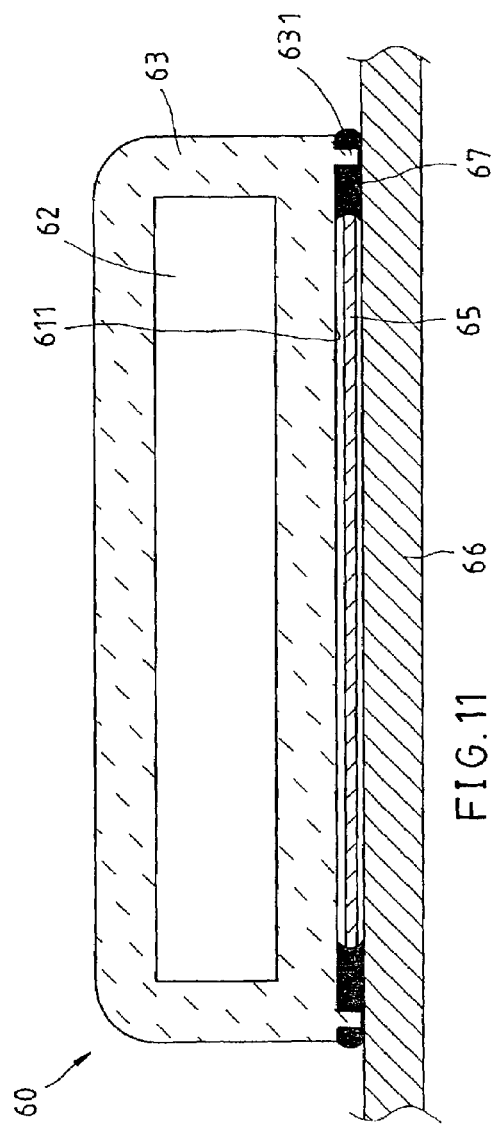
FIG. 11 is a sectional view taken along line 11—11 of FIG. 10.
Figure 10:
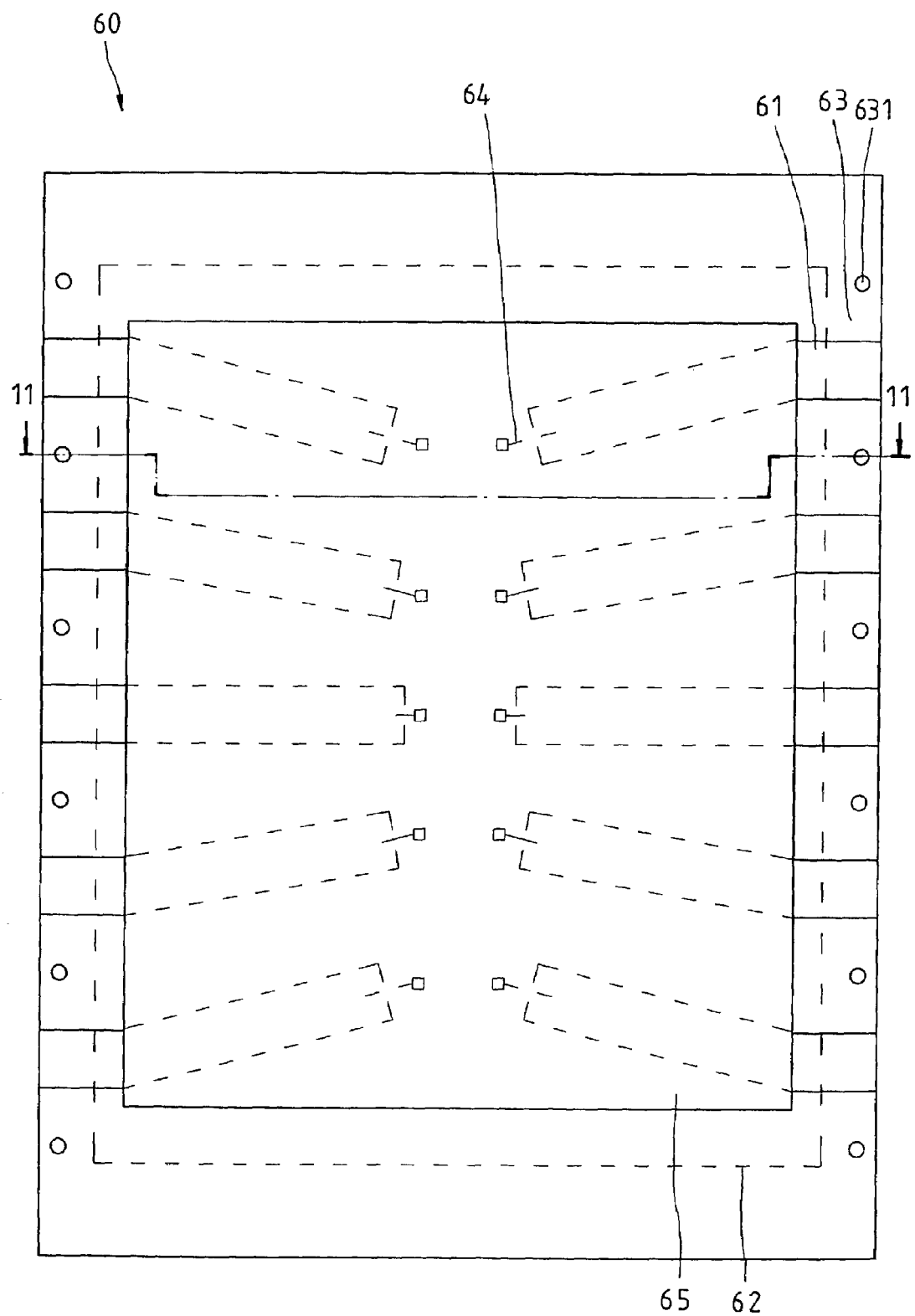
FIG. 10 is a bottom view of an IC chip package constructed according to a sixth embodiment of the present invention.

FIGS. 10 and 11 show an IC chip package 60 constructed according to the sixth embodiment of the present invention. According to this embodiment, the IC chip package 60 is comprised of a carrier 61, a chip 62, a chip shield 63, bonding wires 64, and a protective member 65. The main features of this embodiment are outlined hereinafter.

The chip shield 63 has a plurality of downward locating rods 631 suspended around the periphery of the carrier 61 and downwardly protruded over the bottom side 611 of the carrier 61 at a distance about 0.4 mm. When bonding the carrier 61 to the external circuit board 66 with a bonding agent 67, the downward locating rods 631 of the chip shield 63 hold the carrier 61 on the external circuit board 66 for positive positioning, preventing excessive displacement of the carrier 61 relative to the external circuit board 66 due to uneven contraction of the bonding agent 67 by cold.

Figure 12:
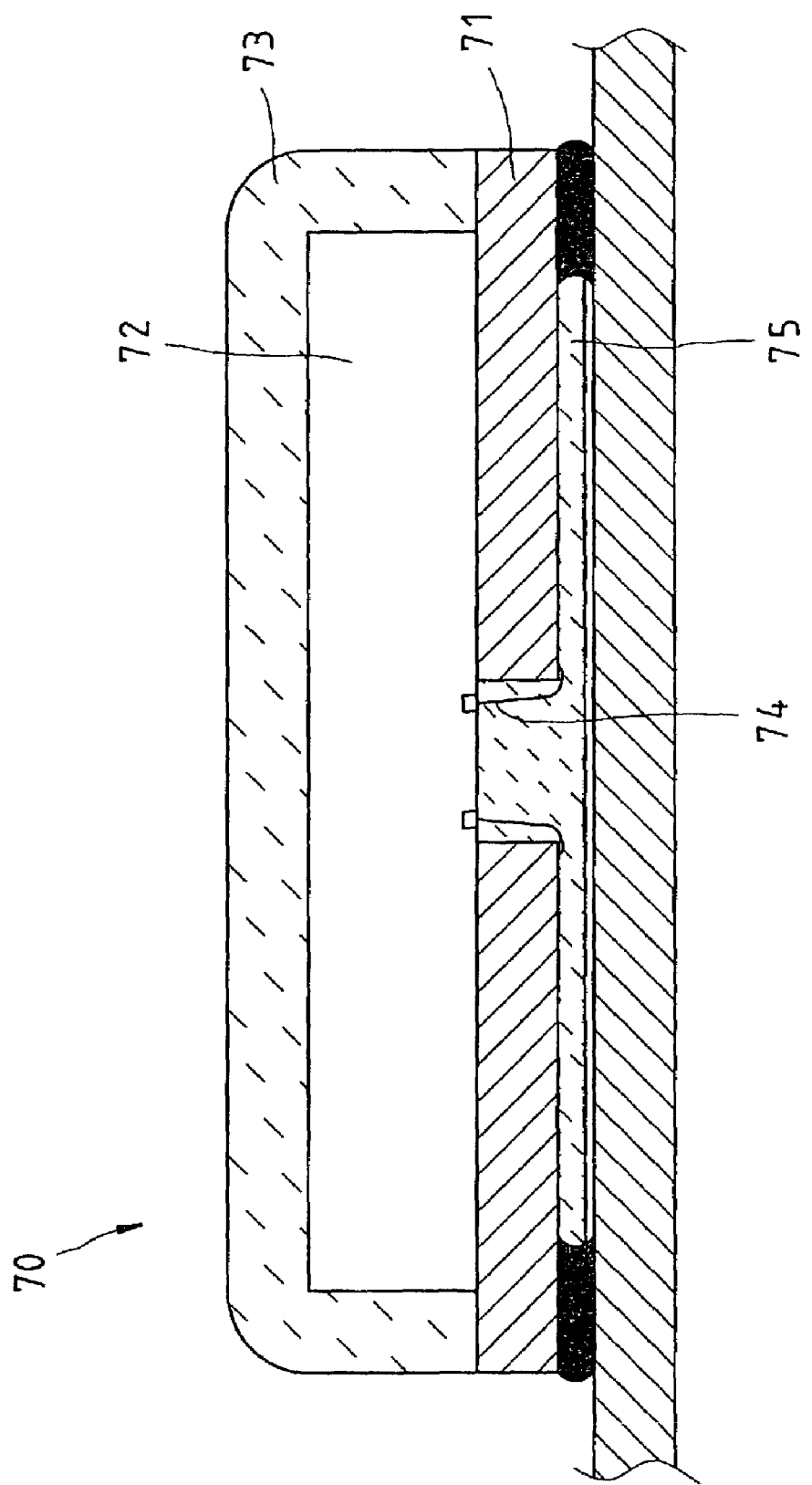
FIG. 12 is a sectional view of an IC chip package constructed according to a seventh embodiment of the present invention.

FIG. 12 shows an IC chip package 70 constructed according to the seventh embodiment of the present invention. According to this embodiment, the IC chip package 70 is comprised of a carrier 71, a chip 72, a chip shield 73, bonding wires 74, and a protective member 75. The main features of this embodiment are outlined hereinafter.

The carrier 71 is made of metal and formed of a plurality of contact leads for carrying the chip 72 and electrically connecting the chip 72 to an external circuit board. The protective member 75 is molded from synthesized resin, for example, epoxy resin or silicon resin.

What the invention claimed is:

1. An IC chip packaging comprising:
   a carrier having a topside, a bottom side and a passage having an opening on the topside and another opening on the bottom side;
   a chip mounted on the topside of the carrier and covering the opening on the topside;
   a plurality of bonding wires, said bonding wires each having one end electrically connected to said chip covered on the opening on the topside and an opposite end horizontally electrically connected to the bottom side of the carrier through the opening on the bottom side; and
   a first protective member is formed at least in part as a thin sheet member which is flat on both an upper and a bottom side thereof covering the opening on the bottom side of the carrier and the opposite ends of the bonding wires, said thin sheet member having a depth vertically extended from a bottom side thereof to said carrier within 0.4 mm; and wherein said thin sheet member flattens said opposite ends of said bonding wires toward the bottom side of the carrier when engaged to the carrier.

2. The IC chip package as claimed in claim 1, wherein the height extended vertically from the bottom side of said thin sheet member to said carrier is preferably within 0.08~0.125 mm.

3. The IC chip package as claimed in claim 1, wherein said thin sheet member is bonded to the bottom side of said carrier by a bonding agent and covered over the opening on the bottom side and the opposite ends of the bonding wires.

4. The IC chip package as claimed in claim 1, wherein said first protective member is made of one of synthesized resins including epoxy resin and silicon resin and directly molded on the opening on the bottom side and said opposite ends of said bonding wires.

5. The IC chip package as claimed in claim 3, further comprising a second protective member made of one of synthesized resins including epoxy resin and silicon resin and directly sealed in said passage above said thin sheet member.

6. The IC chip package as claimed in claim 1, further comprising a chip shield covered on said carrier to encapsulate said chip.

7. The IC chip package as claimed in claim 6, wherein said chip shield is a plate member made of material selected from a group of materials including opaque plastics, metal, transparent glass, and transparent plastics, and bonded to said carrier to protect said chip.

8. The IC chip package as claimed in claim 6, wherein said chip shield is made of one of synthesized resins including epoxy resin and silicon resin, and directly molded on said chip.

9. The IC chip package as claimed in claim 6, wherein said chip shield comprises a plurality of locating rods adapted for holding said carrier in place when bonding said carrier to an external circuit board.

10. The IC chip package as claimed in claim 1, wherein said carrier further comprises a conductive circuit pattern on the bottom side adapted for connecting an external circuit board, the conductive circuit having a plurality of bonding pads electrically connected to the opposite ends of the bonding wires.

11. The IC chip package as claimed in claim 10, wherein said thin sheet member covers over the conductive circuit pattern and the bonding pads, the thin sheet member having at least one through hole corresponding to the conductive circuit pattern and inserted therein with an electrically conducting glue for enabling said conductive circuit pattern to be electrically connected to an external circuit board.

12. The IC chip package as claimed in claim 11, further comprising at least one electrically conducting member embedded in said at least one through hole.

13. The IC chip package as claimed in claim 1, wherein said carrier is a single-layer circuit board.

14. The IC chip package as claimed in claim 1, wherein said carrier is a laminated circuit board.

15. The IC chip package as claimed in claim 1, wherein said carrier is comprised of a plurality of contact leads.

16. The IC chip package as claimed in claim 1, wherein the thin sheet member is preformed.

* * * * *